(12) United States Patent
Aoyama et al.

(10) Patent No.: US 10,563,096 B2
(45) Date of Patent: Feb. 18, 2020

(54) CONDUCTIVE ADHESIVE COMPOSITION

(71) Applicant: FURUKAWA ELECTRIC CO., LTD., Tokyo (JP)

(72) Inventors: Masami Aoyama, Tokyo (JP); Noriyuki Kirikae, Tokyo (JP)

(73) Assignee: FURUKAWA ELECTRIC CO., LTD., Tokyo (JP)

(*) Notice: Subject to any disclaimer, the term of this patent is extended or adjusted under 35 U.S.C. 154(b) by 3 days.

(21) Appl. No.: 15/428,384

(22) Filed: Feb. 9, 2017

(65) Prior Publication Data

US 2017/0152410 A1 Jun. 1, 2017

Related U.S. Application Data

(63) Continuation of application No. PCT/JP2015/072712, filed on Aug. 10, 2015.

(30) Foreign Application Priority Data

Aug. 29, 2014 (JP) .................................. 2014-175974

(51) Int. Cl.
   *C09J 9/02* (2006.01)
   *C09J 11/06* (2006.01)
   (Continued)

(52) U.S. Cl.
   CPC .............. *C09J 9/02* (2013.01); *C09J 11/06* (2013.01); *C09J 179/085* (2013.01);
   (Continued)

(58) Field of Classification Search
   None
   See application file for complete search history.

(56) References Cited

U.S. PATENT DOCUMENTS

| 4,607,091 A | 8/1986 | Schreiber |
| 5,021,484 A | 6/1991 | Schreiber et al. |

(Continued)

FOREIGN PATENT DOCUMENTS

| JP | S60-196956 A | 10/1985 |
| JP | 2002-239785 A | 8/2002 |

(Continued)

OTHER PUBLICATIONS

Sigma-Aldrich, Glutaric acid, available at https://www.sigmaaldrich.com/catalog/product/aldrich/g3407?lang=en&region=US. (Year: 2018).*

(Continued)

*Primary Examiner* — Scott R. Walshon
*Assistant Examiner* — Elaine M Vazquez
(74) *Attorney, Agent, or Firm* — Oliff PLC (57) ABSTRACT

A conductive adhesive that does not contain toxic substances such as solder (lead) and shows excellent adhesiveness. Specifically, it is a conductive adhesive composition, which includes: (A) a thermosetting resin; (C) a filler that contains a metal element; and (D) at least one catalyst or curing agent, wherein the reaction initiation temperature for the (A) thermosetting resin and the (D) at least one catalyst or curing agent is 180° C. or higher. More preferably, the reaction initiation temperature is 200° C. or higher. More preferably, it is a conductive adhesive composition that further includes (B) a flux and (E) a polymer component.

16 Claims, 1 Drawing Sheet

(51) Int. Cl.
  *H01L 21/52* (2006.01)
  *C09J 179/08* (2006.01)
  *H01L 21/683* (2006.01)
  *H01L 21/78* (2006.01)
(52) U.S. Cl.
  CPC .......... *H01L 21/52* (2013.01); *H01L 21/6836* (2013.01); *H01L 21/78* (2013.01); *C09J 2201/602* (2013.01); *C09J 2203/326* (2013.01); *C09J 2400/163* (2013.01); *C09J 2479/08* (2013.01)

(56) References Cited

U.S. PATENT DOCUMENTS

| | | | |
|---|---|---|---|
| 5,200,452 | A | 4/1993 | Schreiber |
| 6,592,020 | B1* | 7/2003 | Currie .................. B23K 35/025 148/23 |
| 2008/0166543 | A1* | 7/2008 | Zhuo .......................... C09J 5/06 428/323 |
| 2010/0059872 | A1* | 3/2010 | Katsurayama ............. C09J 9/02 257/686 |
| 2012/0067629 | A1 | 3/2012 | Jang et al. |
| 2013/0279118 | A1 | 10/2013 | Koyama et al. |
| 2014/0131898 | A1* | 5/2014 | Shearer .................. H01L 24/29 257/783 |

FOREIGN PATENT DOCUMENTS

| | | |
|---|---|---|
| JP | 2004-335872 A | 11/2004 |
| JP | 2005-146408 A | 6/2005 |
| JP | 2006-150413 A | 6/2006 |
| JP | 2006-199937 A | 8/2006 |
| JP | 2010-059387 A | 3/2010 |
| JP | 2012-505509 A | 3/2012 |
| JP | 2012-082516 A | 4/2012 |
| JP | 2012-188646 A | 10/2012 |
| KR | 100977163 B1 | 8/2010 |
| WO | 2008/023452 A1 | 2/2008 |
| WO | 2008/026517 A1 | 3/2008 |
| WO | 2010/041224 A1 | 4/2010 |
| WO | 2012/102077 A1 | 8/2012 |
| WO | 2014/129006 A1 | 8/2014 |

OTHER PUBLICATIONS

Goto, Yasushi, "Anisotropic Conductive Film," Professional Report, 2007, vol. 89, No. 5, pp. 436-437.
Oct. 13, 2015 International Search Report issued in International Patent Application No. PCT/JP2015/072712.
Feb. 28, 2017 International Preliminary Report on Patentability issued in International Patent Application No. PCT/JP2015/072712.
Hara, Osamu, "Curing Agents for Epoxy Resin," Three Bond Technical News, Dec. 20, 1990, pp. 1-10.
Oct. 30, 2017 Office Action issued in Korean Patent Application No. 10-2016-7033471.
Feb. 1, 2018 Extended Search Report issued in European Patent Application No. 15837005.6.
Apr. 17, 2018 Office Action issued in Japanese Patent Application No. 2015-557251.

* cited by examiner

CONDUCTIVE ADHESIVE COMPOSITION

This is a Continuation of International Application No. PCT/JP2015/072712 filed Aug. 10, 2015, which claims the benefit of Japanese Application No. 2014-175974 filed Aug. 29, 2014. The disclosures of the prior applications are hereby incorporated by reference herein in their entirety.

TECHNICAL FIELD

The present invention relates to a conductive adhesive composition, and mainly relates to a conductive adhesive composition that is used in the assembly of electronics and mounting of electronic parts.

BACKGROUND ART

In the assembly of electronics or the mounting process of electronic parts, solder bonding has been widely used as a means for joining electronic parts to the circuit wiring. However, in recent years, due to environmental issues, attempts to suppress the use of harmful substances is gaining momentum. The suppression of lead contained in solder is being actively studied and the use of lead-free solder is being sought.

On the other hand, as a joining method that does not utilize solder, there is a method of using conductive adhesives. As a means for conductive adhesive, the Anisotropic Conductive Film (ACF) is known (for example, see Non-patent Document). By adding pressure, the conductive particles in the film come in physical contact, thereby expressing conductivity, and the binder resin bears the adhesive function. Further, a conductive adhesive, in which part of the surface of the conductive particle dissolves during thermo-compression to integrate the conductive particles, is disclosed (for example, see Patent Document 1).

RELATED ART

Patent Documents

Patent Document 1: WO2012/102077

Non-Patent Documents

Non-patent Document 1: Hitachi Review Vol. 89 No. 05 "Professional Report: Anisotropic Conductive Film"

SUMMARY

However, in the above ACF and conventional conductive adhesives, the adhesive strength is often insufficient. For example, if curing of the thermosetting resin progress more quickly than the melting and bonding of the conductive filler in the adhesive composition, the bonding of the filler may be hindered.

The present invention was made in view of the above-described problems and specifically, provides a conductive adhesive that shows superior adhesiveness without containing harmful substances such as solder (lead).

That is, the present invention relates to a conductive adhesive composition, which comprises
(A) a thermosetting resin;
(C) a filler that contains a metal element; and
(D) at least one catalyst or curing agent,
wherein the reaction initiation temperature for the (A) thermosetting resin and the (D) at least one catalyst or curing agent is 180° C. or higher.

Further, the reaction initiation temperature may preferably be 200° C. or higher at times.

The conductive adhesive composition wherein the reaction initiation temperature between the aforementioned (A) and (D) is 180° C. or higher shows superior adhesive strength, because, as described above, since the bonding of the filler may be hindered if the curing of the thermosetting resin progresses more quickly than the melting and bonding of the conductive filler in the adhesive composition, by setting the curing initiation temperature of the thermosetting resin at a higher temperature, the bonding of the filler proceeds more smoothly. When the reaction initiation temperature is 200° C. or higher, the bonding of the filler is not hindered up to a higher temperature region, and the bonding between the fillers and the bonding between the filler and substrate are more likely to progress.

The present invention is especially effective in low-melting point solders.

Further, the (A) thermosetting resin is preferably an epoxy resin or a polyimide resin. Among these, bismaleimide resin is especially preferable.

The (A) thermosetting resin preferably amounts to 0.5 to 20.0 percent by mass of the total mass of the solid content of the conductive adhesive composition.

Further, it is preferable that the conductive adhesive composition comprises (B) a flux.

The average particle size of the (B) flux is preferably 30 μm or smaller.

The (B) flux contains at least a carboxylic acid with a molecular weight of 300 or less.

Further, the (C) filler preferably contains a conductive particle C1, which contains at least one metal element R1, wherein R1 is at least one metal element selected from the group consisting of Cu, Ag, Au, Pt, Ir, Os, Pd, Ru, Ga, In, Al, Re, Zn, Ni, Sn, Bi and Sb.

The (C) filler is preferably a mixture that further contains a conductive particle C2, which contains a metal element R2.

The (C) filler preferably amounts to 75 percent by mass or more of the total mass of the solid content of the conductive adhesive composition.

The (C) filler is preferably one that is capable of forming a sintered compact.

Further, it is preferable that the melting point of a new alloy formed by the reaction between conductive particle C1 and conductive particle C2 is lower than the melting point of R1.

Further, it is preferable that the conductive adhesive composition further comprises a (E) polymer component.

The compounding ratio of the (E) polymer component is preferably 5 to 50 percent by mass of the solid content of the conductive adhesive composition, excluding the mass of the (C) filler.

The present invention relates to an adhesive film, which comprises the above-described conductive adhesive composition coated on to a substrate, and further, an adhesive film with dicing tape, which comprises such adhesive film laminated on to a dicing tape.

Effect of the Invention

The present invention is capable of providing a lead-free conductive adhesive composition that shows superior adhesive property.

DESCRIPTION OF SOME EMBODIMENTS

(A) Thermosetting Resin

The thermosetting resin of the present invention refers to a modified or unmodified resin that has not been completely cured and/or crosslinked, and includes any precursor that is suitable for producing a thermosetting plastic and/or a thermosetting resin. For example, natural or synthetic monomers, oligomers, or polymers, which may undergo (radical) polymerization reaction, condensation polymerization, and/or polyaddition reaction to undergo further curing and/or crosslinking, are listed.

Note that in the present specification, the terms "cure" and "crosslink" refer to the reaction in which a crosslinked structure or a cured structure with a high molecular weight, as compared to its corresponding uncured resin, is generated by the reaction of the thermosetting resin and the catalyst and/or the curing agent.

An arbitrary thermosetting resin is added as a means to improve the adhesiveness and high-temperature performance of the conductive adhesive composition. Further, it inactivates the flux.

As the thermosetting resin, for example, epoxy resin, phenol resin, novolac (phenol and/or cresol), polyurethane resin, polyimide resin, cyanate ester resin, polyvinyl alcohol resin, polyester resin, polyurea resin, benzoxazine resin, acrylate resin, cyanate ester resin and/or combinations thereof may be listed, but are not limited to these.

In particular, when inactivating the flux, a method of modifying the thermosetting resin so that it reacts with carboxyl acid or phenol group is also known.

As such modified resin, for example, acrylic resin, rubber (butyl group, nitrile etc.), polyamide, polyacrylate, polyether, polysulfone, polyethylene, polypropylene, polysiloxane, polyvinyl acetate/polyvinyl ester, polyolefin, polycyanoacrylate, and polystyrene may be listed. As long as the resin is modified so as to include at least one of the following functional groups, it will function as an arbitrary thermosetting resin in the composition of the present application. Typically, anhydride, carboxyl acid, amide, imide, amine, alcohol/phenol, aldehyde/ketone, nitro, nitriles, carbamate, isocyanates, amino acid/peptide, thiol, sulfonamide, semicarbazone, oxime, hydrazone, cyanohydrins, ureas, phosphoric ester/acid, thiophosphoric ester/acid, phosphonic ester/acid, phosphite, phosphonamide, sulfonic ester/acid, or any other functional group that is known to function as a reactive site for polymerization by persons skilled in the art, may be listed.

Resins that do not contain reactive sites for bonding and show poor adhesive properties, such as unmodified polypropylene, are not suitable as the thermosetting resin in the present invention.

In the present invention, the epoxy resin and benzoxazine resin, or the combination thereof, bring favorable mechanical strength and/or high thermal stability.

As the epoxy resin, polyfunctional epoxy-containing compounds such as glycidyl ether of C2-28 diol, C1-28 alkyl or polyphenol glycidyl ether, polyglycidyl ethers of pyrocatechol, resorcinol, hydroquinone, 4,4'-dihydroxy diphenyl methane (or bisphenol F, for example RE-303-S or RE-404-S by Nippon Kayaku Co., Ltd.), 4,4'-dihydroxy-3, 3'-dimethyldiphenyl methane, 4,4'-dihydroxy diphenyl methylmethane, 4,4'-dihydroxydiphenyl cyclohexane, 4,4'-dihydroxy-3,3'-dimethyldiphenyl propane, 4,4'-dihydroxy diphenyl sulfone, and Tris(4-hydroxyphenyl)methane; polyglycidyl ethers of transition metal complexes; chlorides and bromides of the aforementioned diphenols, polyglycidyl ether of novolak; polyglycidyl ether of the diphenol obtained by the esterification of the ester of diphenol obtained by the esterification of the salt of aromatic hydroxycarboxylic acid and dihaloalkane or dihalogen alkylether; polyglycidyl ether of the polyphenol obtained by the condensation of a phenol and long-chain paraffin halide with at least two halogen atoms; phenol novolak epoxy resin, cresol novolak epoxy resin, and combinations thereof, may be listed.

As commercially available epoxy resins, polyglycidyl derivatives of phenolic compounds such as EPON 825, EPON 826, EPON 828, EPON 1001, EPON 1007 and EPON 1009 (products of Huntsman Corporation), Epiclon EXA 83° CRP, Epiclon EXA 85° CRP, Epiclon EXA 835 LVP (products of DIC Corporation), YD-825GS, YD-825GSH (products of Nippon Steel and Sumikin Chemical Co., Ltd.), Epalloy 5000, Epalloy 5001 (products of CVC Chemicals), alicyclic epoxy-containing compounds such as Araldite CY 179 (product of Huntsman Corporation), Epalloy 5200 (product of CVC Chemicals), Celloxide 2021P (product of Daicel Corporation), or aqueous dispersion of product name EPI-REZ 3510, EPI-REZ 3515, EPI-REZ 3520, EPI-REZ 3522, EPI-REZ 3540, or EPI-REZ 3546 (products of Hexion Inc.); DER 331, DER 332, DER 354 and DER 542 (products of Dow Chemical Company); GY 285 (product of Huntsman Corporation); and BREN-S (product of Nippon Kayaku Co., Ltd.) may be listed. Other suitable epoxy-containing compounds include polyepoxide prepared from polyols etc., and polyglycidyl derivatives of phenol-formaldehyde novolak. Polyglycidyl derivatives of phenol-formaldehyde novolak may be obtained with the product names of DEN 431, DEN 438, and DEN 439 (products of Dow Chemical Company), Epiclon N-740, Epiclon N-770, Epiclon N-775 (product of DIC Corporation), and aqueous dispersion ARALDITE PZ 323 (product of Huntsman Corporation).

As the cresol analogue, for example, ECN 1273, ECN 1280, ECN 1285, and ECN 1299, or Epiclon N-660, Epiclon N-665, Epiclon N-670, Epiclon N-673, Epiclon N-680, Epiclon N-695 (products of DIC Corporation), or aqueous dispersion ARALDITE ECN 1400 (products of Huntsman Corporation), are available. SU-8 and EPI-REZ 5003 are bisphenol A-type epoxynovolak resins that are available from Hexion Inc.

The hydrolysable chlorine concentration of the epoxy resin is preferably 200 ppm or lower. Further, when the hydrolysable chlorine concentration of the epoxy resin exceeds 200 ppm, the thermosetting resin may cure before the conductive particles begin to fuse, thereby causing the connection property to decrease. It is preferable that this hydrolysable chlorine concentration is 100 ppm or lower. Further, in the entire conductive adhesive composition, it is preferable that the hydrolysable chlorine concentration is 1000 ppm or lower.

Among the epoxy resins that are commercially available, there are products that satisfy the requirements of the hydrolysable chlorine concentration. For example, YD-825GS, YD-825GSH (product of Nippon Kayaku Co., Ltd.) are applicable. For those epoxy resins that have higher hydrolysable chlorine concentration, by subjecting to purification treatments such as distillation, the desired chlorine concentration can be obtained. However, it is virtually impossible to completely remove the hydrolysable chlorine, and thus, a concentration of 0 is not included.

A suitable benzoxazine resin may comprise the following structure.

[Chemical Formula 1]

[In the formula, o is 1 to 4, X is selected from a direct bond (when o is 2), alkyl (when o is 1), alkylene (when o is 2 to 4), carbonyl (when o is 2), oxygen (when o is 2), thiol (when o is 1), sulfur (when o is 2), sulfoxide (when o is 2), and sulfone (when o is 2), R1 is selected from hydrogen, alkyl, alkylene, and aryl, and $R^4$ is selected from hydrogen, halogen, alkyl, and alkenyl, or $R^4$ is a bivalent group that forms a naphthoxazine group from a benzoxazine structure.]

Or, the benzoxazine resin may comprise the following structure.

[Chemical Formula 2]

[In the formula, p is 2, Y is selected from biphenyl (when p is 2), diphenylmethane (when p is 2), diphenyl isopropane (when p is 2), diphenyl sulfide (when p is 2), diphenyl sulfoxide (when p is 2), diphenyl sulfone (when p is 2) and diphenyl ketone (when p is 2), and $R^4$ is selected from hydrogen, halogen, alkyl, and alkenyl, or $R^4$ is a bivalent group that forms a naphthoxazine group from a benzoxazine structure.]

Of course, different combinations of the benzoxazine resins or different combinations of a benzoxazine resin and epoxy resin may be suitable for use in the present invention.

Currently, benzoxazine compounds are commercially available from several suppliers including Huntsman Advanced Materials: Georgia-Pacific Resins, Inc.; and Shikoku Chemicals Corporation (Chiba, Japan). However, if necessary, usually, benzoxazine may be prepared by reacting, phenol-type compounds such as bisphenol A, bisphenol F, bisphenol S, or tiodiphenol with aldehydes and arylamines. For example, see U.S. Pat. Nos. 4,607,091, 5,021,484, and 5,200,452.

Polybenzoxazole resin is provided in the form of a precursor and undergoes cyclization reaction by heating. As such polybenzoxazole resin, for example, the following may be listed.

A copolymer of polybenzoxazole precursor that comprises a structure shown in the following formula:

[Chemical Formula 3]

(In the formula, U, V, W are bivalent organic groups, at least one of U and V is a group that contains an aliphatic chain structure with 1 to 30 carbons, X is a bivalent organic group that contains an aromatic ring structure, j and k indicate the molar fraction of the A structure unit and the B structure unit, and the sum of j and k is 100 mol %).

As the polyimide resin, there are those that are provided as precursors that undergo cyclization reaction by heating, and thermosetting polyimide resins that undergo curing by adding a reactive functional group at the terminal of the imide oligomer, and proceeding the crosslinking reaction between the imide oligomer chains by heating. The former is, for example, 3,4,3',4'-biphenyltetracarboxylic dianhydride-p-phenylene diamine polyimide (BPDA-PPD PI). As the thermosetting polyimide resin, mainly, there are the PMR polyimide, the acetylene-terminal polyimide, and the bismaleimide. PMR polyimides have the highest thermal resistivity and bismaleimide may be cured at low pressure.

As the bismaleimide resin, for example, the following structure:

[Chemical Formula 4]

Wherein Q is a substituted or unsubstituted aliphatic, aromatic, heteroaromatic, siloxane part, or a combination thereof, and it is preferable that it has a structure in which an alicyclic hydrocarbon with 5 to 8 carbons is substituted by at least four alkyl groups with 4 to 12 carbons. X1 to X4 are each independently H or an alkyl group with 1 to 6 carbons.

Among these, it is preferable that a "$C_{36}$" structure containing a cyclohexane-base core and four long "arms" attached thereto is comprised.

[Chemical Formula 5]

As a bismaleimide resins with such structure, the following compounds may be listed.

[Chemical Formula 6]

The appropriate amount of the thermosetting resin may be 0.5 to 20.0 percent by mass of the solid content of the conductive adhesive composition, or preferably, 1 to 10.0 percent by mass of the solid content of the conductive adhesive composition, or more preferably, 3 to 10 percent by mass of the solid content of the conductive adhesive composition.

(B) Flux

The flux is useful in removing the oxide film, which interfere with the melting and fusion of the conductive particle. As the flux, any known compound may be used without particular limitation, as long as the compound does not impede the curing reaction of the thermosetting resin. For example, carboxylic acids, inorganic acids, alkanolamines, phenols, rosins, chloride compounds and their salts, halide compounds and their salts etc. may be listed, but the flux material suitable for use in the composition of the present invention are alkanolamines, carboxylic acids, phenols, and mixtures thereof.

In a specific embodiment, the flux is composed of a salt or mixture of carboxylic acid and tertiary amine, and may be of potentiality. In another embodiment, the flux may be inactivated at the completion of the heat treatment of the conductive adhesive composition, and typically, is inactivated by insertion through the reaction between the functional group of the flux and the thermosetting resin. However, it is preferable that the flux is a compound that does not initiate the curing of the thermosetting resin at a temperature of 180° C. or lower.

The carboxylic acid that is suitable for use in the present invention may essentially be a monomer, oligomer, or polymer.

The carboxylic acid used may have a plurality of functional groups to promote the effective reaction with the overall organic matrix, particularly the thermosetting resin. A plurality of carboxylic acid may be blended, in order to create optimum balance with other system components, lubricity, viscosity in relation to its reactivity with other organic components, flux activity such as miscibility, and other properties. The necessary amount for the surface area of the reactive metal R1 is determined by considering the acid strength of each carboxylic acid functional group and the weight.

As the aforementioned carboxylic acid, for example, acrylic acid, methacrylic acid, maleic acid, fumaric acid, valeric acid, hexanoic acid, heptanoic acid, 2-ethylhexanoic acid, octanoic acid, 2-methyl heptanoic acid, 4-methyl octanoic acid, nonanoic acid, decanoic acid, neodecanoic acid, dodecanoic acid, tetradecanoic acid, lauric acid, myristic acid, palmitic acid, stearic acid, oleic acid, linoleic acid, linolenic acid, lactic acid, malic acid, citric acid, benzoic acid, phthalic acid, isophthalic acid, oxalic acid, malonic acid, succinic acid, glutaric acid, adipic acid, pyruvic acid, butyric acid, pivalic acid, 2,2-dimethyl butyrate, 3,3-dimethyl butyrate, 2,2-dimethyl valerate, 2,2-diethyl butyrate, 3,3-diethyl butyrate, naphthenic acid, cyclohexanedicarboxylic acid, 2-acryloyloxyethyl succinate, 2-methacryloyloxyethyl succinate, 2-acryloyloxyethyl hexahydro phthalate, 2-methacryloyloxyethyl hexahydro phthalate, 2-acryloyloxyethyl phthalate, 2-methacryloyloxyethyl phthalate, etc. may be listed. One may be used or two or more carboxylic acids may be used in combination. In a particular embodiment, in order to prevent abnormal increase in viscosity when applying the conductive adhesive composition, and to contribute to the bonding of the conductive particles, the molecular weight of the carboxylic acid is preferably 150 to 300. In another embodiment, dicarboxylic acid are preferable. As such dicarboxylic acid, oxalic acid, malonic acid, succinic acid, glutaric acid, fumaric acid, maleic acid etc. may be listed.

The tertiary amine is used as a mixture or salt with acidic functional groups, and forms a buffer solution or salt with the acidic functional group of the carboxylic acid, in order to prevent excessively rapid reaction with other organic components. The tertiary amine may be a monomer, oligomer, or polymer combined with one or more compound.

Tertiary alkanolamines such as triethanolamine and N,N,N, as well as N,N,N',N'-Tetrakis (2-hydroxyethyl) ethylenediamine may be listed as those suitable in forming buffer mixtures or salts with the carboxylic acidic functional group.

The flux may be introduced to the conductive film adhesive composition of the present invention in various different forms. For example, in a state of compatibility in thermosetting resin, in a state of mixture as a particle, in a state of being coated on the conductive particle, etc., may be listed. For the coating of conductive particles, stearic acid, oleic acid, palmitic acid, etc., which are higher fatty acids, are suitable. In a particular embodiment, it is preferable that the flux is a particle or liquid.

The average particle size of the flux in particle form is 30 µm or smaller, and is preferably 15 µm or smaller.

By having an average particle size of 15 µm or smaller, the metal becomes easier to melt. It is speculated that by having a smaller average particle size, the apparent melting point of the flux decreases, making it easier to melt, thereby making it easier to remove the oxide film. Further, from the view point of enabling thin film application of the conductive adhesive composition, the average particle size is preferably 10 µm or smaller, and more preferably, 6 µm or smaller. From the view point of enhancing printability of the conductive adhesive composition, it is preferably 2 µm or smaller. Further, from the view point of operability, thin film application, and printability, the average particle size is preferably 0.01 µm or larger. Here, the term thin film implies a thickness of 20 µm or thinner. Good applicability refers to a state in which the line width is even when applying the conductive adhesive composition by, for example, a dispenser, to draw a line, and a state in which the surface roughness is within 10% of the film thickness when a film is formed by a coater. Further, printability refers to a state in which the paste viscosity on the target does not increase with time when printed continuously by, for example, screen printing.

Note that the term "average particle size" used in the present specification refers to the D50 value of the cumulative volume distribution curve, in which the 50 volume % particle measured by the laser diffraction method has a smaller diameter than this value. The laser diffraction method is preferably performed using the Malvern Mastersizer 2000 of Malvern Instruments Ltd. In this technology, the size of the particle in a suspension or emulsion is measured by the diffraction of laser beam, based on the application of the Fraunhofer or Mie theory. In the present invention, the Mie theory or the modified Mie theory for non-spherical particle is used, and the average particle size or D50 value is related to the scattering measurement at 0.02 to 135° against the incident laser beam. Further, when it is difficult to measure by the laser diffraction method, the particle size was determined from the diameter of a circle, whose area is about the measured value of the sectional area of the particle from the electron microscope image obtained using a scanning electron microscope (SEM).

As a method of adjusting the average particle size of the flux, a method of pulverizing is exemplified. As a method of pulverization, a grinder may be utilized. As for the types of grinder, those known, such as ball mill grinders, jet mill grinders, ultra fine powder grinders, hammer-type grinders, mortars, roller mills, etc., may be listed. Note that the method of adjusting average particle size is not limited to these examples.

The addition amount of the flux in the conductive adhesive composition, is preferably 0.1 to 10.0 percent by mass of the total mass of the solid content of the conductive adhesive composition. It is preferably 0.1 to 2.0 percent by mass of the arbitrary thermosetting resin.

(C) Filler Containing Metal Element

The filler is preferably one that is capable of forming a sintered compact, since stronger bonding is enabled. Sintering is a phenomenon wherein particles in a state of contact are maintained at a temperature below its melting point to let the bonding of particles proceed in the direction of decreasing the surface energy of the entire particle system, to thereby densify the particle system. In one embodiment, the (C) filler contains a metal nanofiller, or consists solely of a metal nanofiller, to accelerate sintering. That is, by having fillers of smaller particle size, the total surface area per unit mass increases drastically, causing the contribution of the surface energy to increase. Thus, the amount of thermal energy necessary for melting decreases, allowing sintering at lower temperatures. As such fillers, silver filler, copper filler, or mixtures thereof may be used, and may be prepared by methods described, for example, in JP-A-2005-146408 and JP-A-2012-082516.

In another embodiment, a new alloy may be formed by the transitive liquid phase sintering of conductive particle C1, which contains metal element R1, and conductive particle C2, which contains metal element R2. In this case, the melting point of the newly formed alloy is preferably lower than the melting point of R1. Further, it is more preferable that it is above the reflow temperature, for example, 260° C. or higher, from the view point of heat resistance reliability. Liquid phase sintering refers to a special form of sintering in which solid powder particle coexist with the liquid phase. In liquid phase sintering, the metals are diffused within each other to form a new alloy and/or intermetallic body. Thus, the mixture becomes densified and homogenized. In transitive liquid phase sintering, as a result of the homogenization of the metal, the time in which it exists in the liquid phase becomes extremely short. That is, the liquid phase has an extremely high solubility in the surrounding solid phase, and thus, quickly diffuses in the solid, finally leading to solidification. By diffusion homogenizing, heating above the equilibrium melting temperature of the metal particle mixture becomes unnecessary to obtain the final composition.

Note that the term "conductive particle" used in the present specification refers to all particle-form substances that increases the electric conductivity of the composition that is formed, when it is added to a non-conductive resin component. The conductive particle may be of various forms such as flake-form and/or branch-form. Preferably, the conductive particle used in the present invention is not a nanowire or nanotube.

In the transitive liquid phase sintering of the present invention, the diffusion and reaction between metal elements R2 and R1 continue until the melting phase disappears in the process temperature, or the reactive element is completely depleted by suppressing the reaction by cooling of the reaction mixture. After cooling, the mixture is not re-melted even when heated above the original melting temperature, which is proof of a typical transitive liquid phase sintered metal mixture. The number and property of the new alloy and/or metal body formed depends on the selected metal components, their relative ratio, particle size distribution, and process temperature. The original metal element R2 and the composition of the residual component of their alloy also depend on the above factors.

The metal element R1, which can be used in transitive liquid phase sintering, is selected from the group consisting of Cu, Ag, Au, Pt, Ir, Os, Pd, Ru, Ga, In, Al, Re, Zn, Ni, Sn, Bi, and Sb. R1 is preferably selected from the group consisting of Cu, Ag, Au, Pt, In, and Ga. More preferably, R1 is selected from the group consisting of Cu and Ag.

The metal element R2 is selected from the group consisting of Sn, Bi, Cd, Zn, Ga, In, Te, Hg, Tl, Sb, Se, and Po. More preferable, R2 is selected from the group consisting of Sn, Bi, Ga, In, and Zn.

Further, it is preferable that both R1 and R2 do not contain Pb (lead).

The conductive particle C1 may be a metal element consisting solely of R1 (not including impurities), or may be an alloy prepared from a plurality of metals including R1. For example, solder as described in HS Z 3282-1999 may be listed. Further, it is preferable that R1 takes up 50 percent by mass or more of C1. The conductive particle C2 may be a metal element consisting solely of R2 (not including impurities), or may be an alloy prepared from a plurality of metals including R2. The combination and compounding ratio of R1 and R2 are disclosed in various documents, and it is preferable to select a suitable one from the phase diagram. However, from the view point of wettability, there are cases where it is preferable to add either R1 or R2 in excess. For example, as the combination that shows superior conductivity, copper-indium system, copper-tin system, silver-indium system, silver-tin system, gold-indium system, gold-tin system, gold-lead system may be listed, but the combination is not limited to these examples. All systems including In show an eutectic point around 150° C., and are superior in that low-temperature sintering proceed smoothly. Further, systems including Sn show an eutectic point around 200° C., and are preferable from the view point of heat resistance reliablity.

As an alloy with a melting point of 200° C. or lower, specifically, Sn42-Bi58 solder (melting point 138° C.), Sn48-In52 solder (melting point 117° C.), Sn42-Bi57-Ag1 solder (melting point 139° C.), Sn90-Ag2-Cu0.5-Bi7.5 solder (melting point 189° C.), Sn89-Zn8-Bi3 solder (melting point 190° C.), Sn91-Zn9 solder (melting point 197° C.) etc., are listed. In particular, alloys with melting points of 180° C. or lower are preferable. Further, alloys that contain Sn are preferable in that they are easy to adjust the melting point to 200° C. or lower, and alloys of Si and Bi are more preferable. Alloys of Si and Bi with an alloy ratio of Sn:Bi=79:21 to 42:58 are especially preferable, since they show eutectic melting point.

The (C) filler may be introduced to the conductive film adhesive composition in various forms. The particle may be a single metal element with two or more factors or an alloy. The particle may be spherical, nonspherical, branch-like, flake, plate-like, porous, etc. In order to enlarge the surface area, spherical or porous forms are advantageous. R1 or R2 may exist as a coating on the surface of another metal element particle, or may exist as a coating on a non-metal particle core.

Further, in order to delay oxidation or to make insertion in to varnish easy, it may be organically coated. As such organic substance, saturated or unsaturated fatty acid may be applied. For organic coating of particles, Cu and Ag are particularly preferable for use.

The average particle size of the filler is one-half of the gap (thickness) between the adherends or smaller. From the view point of making film thinning of device and weight lightening easy, 30 µm or smaller is preferable. A particle size of 10 µm or smaller is further preferable.

When the particle size is 5 µm or smaller, the surface area increases, making the particles more wettable. Thus it is preferable. At a particle size of 1 µm or less, the total surface area per unit mass increases drastically, causing the contribution of the surface energy to increase. Thus, it is preferable in that the amount of thermal energy necessary for melting decreases and sintering at lower temperatures is made possible. Further, the average particle size of a filler is generally 0.005 µm or more. An average particle size of 0.1 µm or more is preferable, since aggregation is less likely to occur, and dispersion in solvent and resin becomes superior. When conductive particles C1 and C2 form a new alloy by transitive liquid phase sintering, the particle size of the particle that contains the metal element that is in excess in the newly formed alloy may be larger than the other. For example, when the former is C1 and the later is C2, since the melting of C2 is accelerated to coat the surroundings of C1, the sintering speed can be accelerated and alloying proceeds in a C1-rich state. Thus, the desired alloy becomes more easy to obtain.

In order to increase the contact points among the filler, the filler preferably amounts to 75 percent by mass or more of the total mass of the solid content of the conductive adhesive composition, and more preferably, amounts to 85 percent by mass or more, and further preferably, amounts to 90 percent by mass or more. In order to exert the dispersion effect in solvents and resins, as well as the adhesion assisting effect, the filler preferably amounts to 99 percent by mass or less, and further preferably, amounts to 98 percent by mass or less. The filler may consist of C1 alone, but when it contains both C1 and C2, the ratio of C1 and C2 in the filler may be selected, taking in consideration the content ratio in the newly formed alloy, or the reactivity, to have one compounded in excess. For example, in a copper-tin system, if one wishes to form $Cu_3Sn$ alloy, the ratio of C1 and C2 may be calculated so that Cu:Sn becomes 3:1 and for $Cu_6Sn_5$ alloy, it may be compounded so that Cu:Sn becomes 6:5. Further, when one wishes that Sn wets the surrounding of Cu sufficiently, the ratio of C1 and C2 may be calculated so that Sn is compounded in excess, or C1 and C2 may be compounded so that Cu:Sn becomes 3:1, and then add more Sn fillers separately.

(D) Catalyst or Curing Agent

In one embodiment of the present invention, as a catalyst or curing agent for the thermosetting resin, curing agents containing dicyandiamide, imidazoles, acid anhydrides, carboxylic acid, amide, imide, amine, alcohol/phenols, aldehydes/ketones, nitro compounds, nitrile, carbamate, isocyanates, amino acid, peptide, thiol, sulfonamide, semicarbazone, oxime, hydrazone, cyanohydrins, ureas, phosphoric ester/acid, thiophosphoric ester/acid, phosphonic ester/acid, phosphite, novolak (both phenol and cresol), phosphine, phosphonamide, etc. may be appropriately used. For example, for epoxy resins, high melting point acid or base is preferable, and dicarboxylic acid (such as isophthalic acid) and amino acid may be listed. Such high melting point acid compounds may also serve as the flux. For polyimide resin, 1,2-dimethyl imidazole, 2-phenyl imidazole, 2,6-lutidine, triethylamine, m-hydroxy benzoic acid, 2,4-dihydroxy benzoic acid, p-hydroxy phenyl acetic acid, 4-hydroxyphenylpropionic acid, peroxides, 2,3-dimethyl-2,3-diphenyl butane, 3,4-dimethyl-3,4-diphenyl hexane, etc. may be listed, but is not limited to these. Any compound that has a reaction initiation temperature with the thermosetting resin at 180° C. or above may be appropriately used. Further, if the reaction initiation temperature is 200° C. or more, the bonding of the filler is less likely to be inhibited up to higher temperatures. Thus, it is preferable, since bonding between the fillers and bonding between the filler and the substrate is more likely to proceed, and the adhesive property and conductivity is enhanced. There is no particular upper limit to the reaction initiation temperature, but taking in consideration the possibility of damage to electronic parts and decomposition of resins, 350° C. or lower is preferably, and 300° C. or lower is more preferable. It is further preferable that the reaction initiation temperature is below the reflow temperature, and in eutectic solder, the reflow temperature is often set with 290° C., 280° C., or 265° C. set as the upper limit.

The optimum compounding amount of the curing agent or catalyst differs for the combination of thermosetting resin and curing agent or catalyst. However, in one embodiment, it is preferable that it 1 to 25 parts by mass is added per 100 parts of thermosetting resin.

(E) Polymer Component

The polymer component contributes to the film-forming of the conductive adhesive composition or for adding stress relaxation property. The polymer component may be any polymer that is easy to handle and compatible with the other components, especially the thermosetting resin, which constitute the conductive adhesive composition. As examples of favorable polymer components, phenoxy, acrylic rubber (butyl group, nitrile, etc.), polyimide, polyamide, polyacrylate, polyether, polysulfone, polyethylene, polypropylane, polysiloxane, poly vinyl acetate/poly vinyl ester, polyolefin, polycyanoacrylate, polystyrene, etc. may be listed. When the mass-average molecular weight is in the range of 10,000 to 200,000, the connecting characteristic and the ease in film-forming both become superior. In a particular embodiment, the polymer component is a phenoxy resin. The compounding ratio of the polymer component is preferably 5 to 50 percent by mass of the solid content of the conductive adhesive composition, excluding the mass of the filler.

In another embodiment, the conductive adhesive composition of the present invention may further include one or more additive such as a plasticizer, an oil, a stabilizer, an antioxidant, a corrosion preventative, a chelating agent, a pigment, a dye, a polymer additive, a defoaming agent, a preservative, a thickener, a rheology-adjusting agent, a moisturizing agent, a tackifier, a dispersant, and water.

For example, as an additive, conductive organic compounds, such as phthalocyanine and its derivatives, anthracene, perylene and its derivatives, are be listed. By coordinating on the surface of a conductive particle according to the method described in Japanese Patent Application No. 2012-505509, phthalocyanine and its derivatives enhances conductivity.

The present embodiment of the conductive adhesive composition may be used in paste-form or film-form. Among these, from the point of crawl-up of the adhesive composition on the adherend during compression bonding, maintaining of allowance, and easy handling, it is preferably in film-form.

In order to form a film of the conductive adhesive composition, it is preferable that the amount of the polymer component is 5 to 50 percent by mass of the solid content in the conductive adhesive composition, excluding the mass of the filler. Further, when the compounding ratio of the polymer component is 5 percent by mass or less of the solid content in the conductive adhesive composition, excluding the mass of the filler, it may be favorable to apply a thermosetting resin, which contains 85 percent by mass or more of the filler in relation to the total mass of the solid content of the conductive adhesive composition, which also has a molecular weight of 2000 or more.

(Adhesive Film)

The adhesive film may be produced by ordinary methods, using the conductive adhesive composition of the present invention. For example, after preparing a solution of the conductive adhesive composition, the conductive adhesive composition solution may be applied on a cover film at a certain thickness to form a coated membrane, and by drying the coated membrane under a certain condition the adhesive film may be produced. The method of application is not particularly limited, and roll coating, screen coating, and gravure coating etc. may be listed. Further, as the drying condition, for example, drying may be performed at a temperature of 70 to 160° C. for a time range of 1 to 5 minutes. As the cover film, a plastic film or paper that is coated with a peeling agent such as polyethylene-telephthalate (PET), polyethylene or polypropylene, fluorine-type peeling agent, and long-chain alkylacrylate-type peeling agent, may be used.

The thickness of the adhesive film is not particularly limited, but may preferably be 1 to 300 μm. When adhering two layers of adherends, the thickness is preferably 5 to 60 μm, and when stress-relaxation is required, the thickness is preferably 60 to 200 μm.

Further, by combining the adhesive film with a dicing tape in the form of a laminate, the adhesive film may be used favorably as an adhesive film with a dicing tape. A dicing tape is a tape that is used mainly in the process of cutting and dicing integrated circuits and packages formed on a semiconductor wafer.

Figure 1:
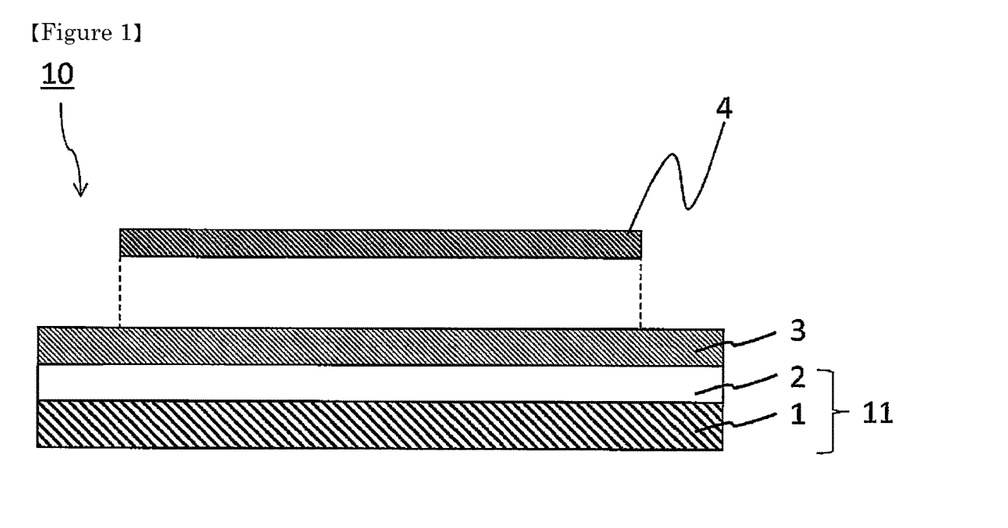
FIG. 1 shows an adhesive film with dicing tape that uses the adhesive of the present invention.
Figure 2:
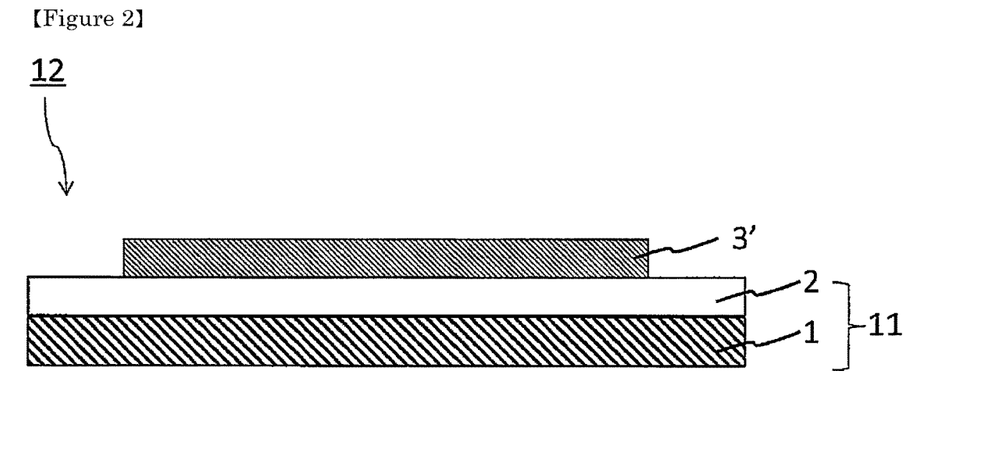
FIG. 2 is a sectional scheme of an embodiment of the adhesive film with dicing tape that differs from FIG. 1.

FIG. 1 and FIG. 2 are schematic diagrams that show the sectional views of one embodiment of the adhesive film with dicing tape of the present invention.

In FIG. 1, the structure of the adhesive film with dicing tape 10, in which the adhesive film 3 is laminated on the dicing tape 11, is shown. The dicing tape 11 is composed of a pressure-sensitive adhesive layer 2 laminated on a substrate 1, and the adhesive film 3 is provided on top of the pressure-sensitive adhesive layer 2. As shown in the adhesive film with dicing tape 12 of FIG. 2, the adhesive film 3' may be formed only on the work-sticking part.

The substrate 1 is the strength matrix of the adhesive film with dicing tape 10, 12 and preferably shows ultraviolet transmission property and expandability when expanded. For example, polyolefins such as polyethylene, polypropylene, polybutene, and polymethylpentene, ethylene-vinyl acetate copolymer, ionomer resin, ethylene-(meth)acrylic acid copolymer, ethylene-(meth)acrylic acid ester (random, alternating) copolymer, ethylene-butene copolymer, ethylene-hexene copolymer, polyurethane, polyesters such as polyethylene terephthalate and polyethylene naphthalate, polycarbonate, polyimide, polyether ether ketone, polyether imide, wholly aromatic polyamide, polyphenylsulfide, aramid (paper), glass, glass cloth, fluorine resin, polyvinylchloride, polyvinylidenechloride, cellulose-type resin, silicone resin, crosslinked bodies of the aforementioned resins, metal (foil), paper etc. can be listed.

In order to enhance adhesion, retention, etc., the surface of the substrate 1 may be subjected to conventional surface treatments such as various chemical and physical treatments like chromic acid treatment, ozone exposure, flame exposure, high voltage lightening exposure, ionizing radiation treatment, coating treatment using primers (such as the later-described adhesive substance).

As the substrate 1, the same or different materials may be arbitrarily selected and used, and several types may be blended and used as necessary. Further, different types may be layered and used.

The thickness of substrate 1 is not particularly limited, but may generally be about 50 to 200 μm.

The adhesive material to be used in the pressure-sensitive adhesive layer 2 is not particularly limited, and general pressure-sensitive adhesive such as acrylic-type adhesive and rubber-type adhesive.

As the adhesive material used to form the pressure-sensitive adhesive layer 2, radiation-curable resins may also be used. The adhesive strength of radiation-curable resins may easily be reduced by irradiation of radiation such as ultraviolet ray to increase the degree of crosslinking.

As the radiation-curable adhesive agent, those having radiation curable functional groups such as carbon-carbon double bonds that also show adhesiveness may be used without particular limitation. For example, addition-type radiation-curable adhesive agents obtained by combining radiation-curable monomer components and oligomer components to general pressure-sensitive adhesive agents such as the aforementioned acrylic-type adhesive agent and rubber-type adhesive agent may be exemplified.

As the radiation-curable monomer component to be combined, for example, urethane oligomer, urethane(meth)acrylate, trimethylol propane tri(meth)acrylate, tetramethylol methane tetra(meth)acrylate, pentaerythritol tri(meth)acrylate, pentaerythritol tetra(meth)acrylate, dipentaerythritol monohydroxy penta(meth)acrylate, dipentaerythritol hexa(meth)acrylate, 1,4-butanediol di(meth)acrylate etc. may be listed. Further, as the radiation-curable oligomer component, various oligomers such as urethane-type, polyether-type, polyester-type, polycarbonate-type, polybutadiene-type may be listed, and those with a molecular weight in the range of 100 to 30000 are suitable. The amount of radiation-curable monomer components and oligomer components may be determined arbitrarily according to the type of pressure-sensitive adhesive layer. In general, the amount is, for example, 5 to 500 parts by mass, or more preferably, 40 to 150 parts by mass, based on 100 parts by mass of the base polymer such as the acrylic polymer composing the pressure-sensitive adhesive layer.

Further, as the radiation-curable adhesive agent, other than the aforementioned addition-type radiation-curable adhesive agent, endogenous-type radiation-curable adhesive agents that have carbon-carbon double bonds on the polymer side chain, main chain, or end of the main chain may be listed as the base polymer. Such endogenous-type radiation-curable adhesive agents do not require the addition of oligomer components etc., or do not contain many. Thus, they are preferable since chronological migration of the oligomer components within the adhesive agent or to the adhesive film 3 does not occur.

Further, as the radiation-curable adhesive agent, for example, rubber-type adhesive agents and acrylic-type adhesive agents containing an addition polymerizable compound having two or more unsaturated bonds as disclosed in JP-A-S60-196956, a photo-polymerizable compound that has an epoxy group such as alkoxysilane and a photopolymerization initiator such as carbonyl compounds, organic sulfur compounds, peroxides, amines, onium salt-type compounds, may be listed.

The thickness of the pressure-sensitive adhesive layer 2 is not particularly limited, but is preferably about 1 to 50 μm. Preferably, the thickness is 2 to 30 μm, or further preferably, 5 to 25 μm.

FIG. 1 shows a clear example of the structure and method for producing a semiconductor device using such an adhesive film with dicing tape.

More specifically, on the semiconductor wafer sticking part of the adhesive film 3 of the adhesive film with dicing film 10, a semiconductor wafer 4 is pressure bonded, and fixed by adhesion holding (adhesion process). This process is performed by a pressurizing means such as a pressurizing roll.

Method for Producing Semiconductor Device

Next, as a method of using the conductive adhesive composition of the present invention, an example of the method for producing semiconductor device using the conductive adhesive composition will be described.

(Adherend)

The conductive adhesive composition of the present invention can bond semiconductor chips, semiconductor chip and support member, or support member and functional members such as a heat dissipation member. Such adherend preferably has a surface that is coated with metal. As the metal on the surface of the adherend, gold, silver, copper, nickel etc., may be listed. Further, among these, a plurality of materials may be patterned on the substrate.

(Production Process)

The method for producing semiconductor device by connecting semiconductor chip with a support member comprises the following processes.

(A) A process of applying the conductive adhesive composition to the semiconductor chip or support member, to bond the semiconductor chip and the support member together. (Hereinafter, referred to as "process (A)".)

(B) A process of heating the conductive adhesive composition, to thereby bond the semiconductor chip with the support member. (Hereinafter, referred to as "process (B)".)

(Process (A))—Process of Applying the Conductive Adhesive Composition—

The conductive adhesive composition may be prepared by mixing the above-described compounds (A) to (D) in a dispersion medium. A stirring process may be performed after mixing. Further, the maximum particle size of the dispersion may be adjusted by filtration.

The stirring process may be performed by using an agitator. As such stirrer, for example, a rotation and revolution-type agitator, a Raikai mixer, a biaxial kneader, three-rolls, planetary mixer, thin-layer shearing disperser, are listed.

Filtration may be performed using a filtering apparatus. As the filter, for example, metal mesh, metal filter, nylon mesh may be listed.

A conductive adhesive layer is formed by applying the conductive adhesive composition on the support member or semiconductor chip. As a method of application, the conductive adhesive composition in paste-form may be coated or printed, or an adhesive film of the conductive adhesive composition may be fixed.

Further, when applying the conductive adhesive composition on a semiconductor chip, chips that have been divided may be used, or the conductive adhesive composition may be applied on to a semiconductor wafer, and then divided in to chips. In the process of dividing the wafer into chips, it is preferable to use the aforementioned conductive adhesive composition in the form of an adhesive film with dicing tape in this process, since it is simple. The adhesive film and dicing tape may be fixed on to the semiconductor wafer separately, and the wafer may be divided into chips afterwards. Or, the conductive adhesive composition in paste-form may be applied or printed on the semiconductor wafer, dried or B-staged, and then the dicing tape may be fixed, after which the wafer is divided into chips. In such a case, the dicing tape may be similar to those used for the adhesive film with dicing tape.

As a method of applying the paste-form conductive adhesive composition, for example, dipping, spray coating, bar coating, die coating, comma coating, slit coating, and applicator may be used. As a method of printing the paste-form conductive adhesive composition, for example, a dispenser, stencil printing, intaglio printing, screen printing, needle dispenser, and the jet dispenser method may be used. The adhesive layer formed by application or printing may be dried or b-staged arbitrarily. As a method of drying, drying by leaving in normal temperature, drying under heated-air, and drying under reduced-pressure, may be used. As a method of drying under heated-air, drying under reduced-pressure, a hot plate, a hot-air dryer, a hot-air furnace, a nitrogen dryer, an infrared dryer, an infrared furnace, a far infrared furnace, a microwave heating device, a laser heating device, an electromagnetic heating device, a heater heating device, a steam furnace, and a hot-plate pressurizing device, etc. may be used. The temperature and time for drying may be adjusted depending on the type and amount of dispersion medium and thermosetting resin used. For example, it is preferable to perform drying at 50 to 180° C. for 1 to 120 minutes.

After forming the adhesive layer, the semiconductor chip and the support member are adhered via the conductive adhesive composition.

(Process (B))—Connection Process—

Subsequently, heat-treatment is performed on the adhesive layer. It may be a simple heat-treatment or a pressurized heat-treatment. For the heat-treatment, a hot plate, a hot-air dryer, a hot-air furnace, a nitrogen dryer, an infrared dryer, an infrared furnace, a far infrared furnace, a microwave heating device, a laser heating device, an electromagnetic heating device, a heater heating device, a steam furnace, etc. may be used. Further, for the pressurized heat-treatment, a hot-plate pressurizing device may be used, or the aforementioned heat-treatment may be performed while adding pressure by a weight.

By subjecting to heat-treatment, the filler in the conductive adhesive composition melts and bonds, while the curing of the thermosetting resin proceeds. In the bonding of the filler, bonding between the filler and the adherend, or the filler and the metal on the surface of the adherend, proceed along with alloying; not just the bonding between fillers. Thus, it is preferable, since interfacial failure becomes less likely to occur, and the preventative effect of peeling and destruction due to difference in linear expansion within the device is enhanced.

By the above-described production method, a semiconductor device in which the semiconductor chip and the support member are bound by the conductive adhesive composition of the present invention can be produced.

Semiconductor Device

The semiconductor device may be used in power modules comprising a diode, a rectifier, a thyristor, a MOS gate driver, a power switch, a power MOSFET, IGBT, short-key diode, fast recovery diode, etc., a transmitter, an amplifier, a LED module, a battery module, etc. The module obtained shows high adhesive property between the adherends and can show thermal conductivity, electric conductivity, and heat resistance.

EXAMPLE

Hereinafter, the present invention will be described more specifically with reference to Examples. However, the present invention is not limited in anyway by these Examples.

A varnish obtained by blending the components shown in Table 1 and a suitable amount of toluene was applied on a cover tape comprising a PET film of 50 μm thickness, and passed through a drying furnace at 140° C. for 5 minutes, to form an adhesive tape with a thickness of 30 μm. This adhesive tape was bonded with a dicing tape to prepare the adhesive film with dicing tape of Examples 1 to 7 and Comparative Example 1 to 5, in an adhesive film roll.

Note that the components used were as follows:

YL980: Bisphenol A-type epoxy resin; Hydrolysable chlorine concentration 150 ppm, product of Mitsubishi Chemical Corporation

EP-4088L: DCPD-type epoxy resin; Hydrolysable chlorine concentration 100 ppm, product of ADEKA Corporation BMI 1: A structure satisfying the following formula:

[Chemical Formula 7]

BMI2: A structure that satisfies the following formula (n=1 to 20); gel

[Chemical Formula 8]

BA-BXZ: Bisphenol A-type benzoxazine; Product of Konishi Chemical Ind. Co., Ltd.

BHPA: 2,2-Bis(hydroxymethyl)propionic acid (product of Tokyo Chemical Industry Co., Ltd.) pulverized by a jet mill (product of Nisshin Engineering Inc., Current Jet); average particle size 10 μm FLUX 1: An adduct compound of N,N,N',N'-Tetrakis (2-hydroxyethyl) ethylenediamine and oleic acid L-threonine: Melting Point 253° C. (decomposition); pKa 2.63

Sn42-Bi58: Spherical solder; Melting point 139° C.; Average particle size 3 μm

Sn72-Bi28: Spherical solder; Melting point 139° C.; Average particle size 3 μm

EA0297: Silver flake, Average particle size 4 μm; Product of Metalor Technologies SA Cu Filler: Spherical copper powder; Average particle size 3 μm; surface treatment by stearic acid m-Phtharic acid: Melting point 210° C. (decomposition); Product of Tokyo Chemical Industry Co., Ltd.

Succinic acid: Melting point 186° C.; product of Tokyo Chemical Industry Co., Ltd.

Nofuma BC-90: 2,3-dimethyl-2,3-diphenylbutane; ten-hour half-life temperature 210° C.; Product of Nippon Oil and Fats Co., Ltd.

2PHZ-PW: 2-phenyl 4,5-dihydroxymethyl imidazole; Product of Shikoku Chemicals Corporation 2PZ: 2-phenyl imidazole; Product of Shikoku Chemicals Corporation Luperox 531M80: 80% 1,1-di-t-amylperoxycyclohexane in Odorless Mineral Spirits; ten-hour half-life temperature 93° C. (dodecane); Product of Arkema Percumyl D: Dicumylperoxide; ten-hour half-life temperature 116° C.; Product of Nippon Oil and Fats Co., Ltd.

PKHA: Phenoxy resin; Molecular weight 25,000; Product of InChem Industry

BPAM-01: CTBN modified polyamide resin; Molecular weight 50,000; Product of Nippon Kayaku Co., Ltd.

TAPE 1: Acryl-type UV dicing tape; Product of Furukawa Electric Co., Ltd.

TAPE 2: Acryl-type UV dicing tape obtained by adjusting the adhesive strength (against #280SUS) to 0.5 N/25 mm or lower by irradiating TAPE 1 in advance.

<Measurement of the Reaction Initiation Temperature>

Figure 3:
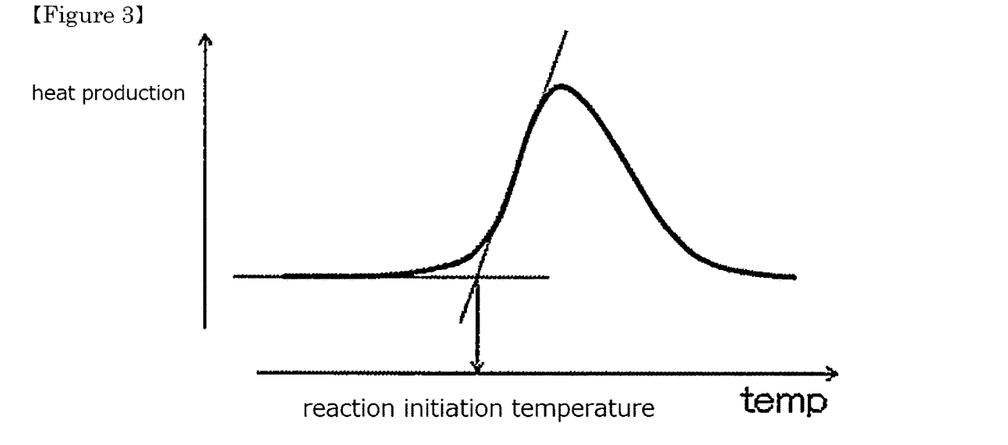
FIG. 3 is a plot showing heat production as a function of reaction initiation temperature.

In the sample container of a differential scanning calorimeter (DSC), 2.0 mg of the conductive adhesive composition of the Examples and Comparative Examples were weighed, and the curing exothermic behavior was plotted to obtain the reaction initiation temperature. For DSC measurement, a heat flux DSC measuring device: DSC-60 by Shimadzu Corporation was used, and a temperature elevation measurement was performed in a sealed container, under nitrogen atmosphere, at a temperature elevation rate of 20° C./min from room temperature to 250° C. The rise temperature at the curing exothermic peak (DSC onset) was obtained from the DSC chart, and this was recorded as the reaction initiation temperature. See FIG. 3.

Adhesive Properties

A sliver plated silicone chip (5 mm×5 mm) and a silver plated substrate (adhesive surface is silver) were bonded via the conductive adhesive composition of the Examples and Comparative Examples with a thickness of 20 heated at 230° C. and 0.5 MPa, under nitrogen atmosphere for 1.5 hours. The adhesive strengths of ten samples were measured. The adhesive strength was measure using the "universal-type bond tester series 4000" of Dage Japan Co., Ltd., at a condition of test temperature of 260° C., test height 10 test speed 50 μm/s, and the fracture mode was observed.

⊚: The chip was mainly fractured in all ten samples.

○: The adhesive was mainly fractured in 1 to 4 samples, and the chip was mainly fractured in all the rest.

X: The adhesive was mainly fractured in 5 or more samples.

Volume Resistivity

The conductive adhesive composition of the Examples and Comparative Examples were coated or adhered on to a glass substrate and heated under nitrogen atmosphere at 230° C. for 1.5 hours to obtain a conductive membrane with a thickness of about 0.1 μm. The volume resistivity of the conductive membrane obtained was measured by mounting the four series probes of a resistivity meter, Loresta GP (product of Mitsubishi Chemical Co., Ltd.), at room temperature.

◯: Volume resistivity was less than $1.0 \times 10^{-4}$ Ωcm
X: Volume resistivity was $1.0 \times 10^{-4}$ Ωcm or more between the epoxy resin and the curing agent is 200° C. or more, excellent adhesive property and conductivity were obtained.

Since Examples 6 and 7 contain bismaleimide resin as the thermosetting resin and the reaction initiation temperature between the bismaleimide resin and the radical initiator is 180° C. or more, both excellent adhesive property and conductivity were obtained.

TABLE 1

|  | Example 1 |  | Example 2 |  | Example 3 |  | Example 4 |  |
|---|---|---|---|---|---|---|---|---|
| Thermosetting Resin | YL980 | 13.5% | YL980 | 8.4% | YL980<br>EP-4088L<br>BA-BXZ | 6.0%<br>2.7%<br>1.2% | YL980 | 3.5% |
| Flux | BHPA | 1.0% | BHPA | 1.4% | L-threonine | 2.8% | BHPA | 0.5% |
| Filler | Sn72—Bi28 | 80.0% | Sn72—Bi28 | 75.7% | Sn72—Bi28 | 78.3% | Sn72—Bi28<br>Cu Filler | 28.6%<br>61.4% |
| Catalyst or Curing Agent | m-Phtharic acid | 5.5% | m-Phtharic acid | 3.9% |  | 0.0% | m-Phtharic acid | 1.6% |
| Polymer Component |  |  | PKHA | 10.6% | PKHA | 10.0% | PKHA | 4.4% |
| Dicing Tape | TAPE1 |  | TAPE1 |  | TAPE1 |  | TAPE1 |  |
| Reaction Initiation Temperature (° C.) | 210 |  | 210 |  | 230< |  | 210 |  |
| Fracture Mode | ⊚ |  | ⊚ |  | ⊚ |  | ⊚ |  |
| Adhesive Strength (MPa) | 11.2 |  | 10.2 |  | 11.2 |  | 15.7 |  |
| Volume Resistivity ($\times 10^{-5}$ Ω·cm) | 7.6<br>◯ |  | 8.7<br>◯ |  | 8.2<br>◯ |  | 6.8<br>◯ |  |

|  | Example 5 |  | Example 6 |  | Example 7 |  | Comparative Example 1 |  |
|---|---|---|---|---|---|---|---|---|
| Thermosetting Resin | YL980 | 3.5% | BMI1 | 23.0% | BMI2 | 6.3% | YL980 | 18.0% |
| Flux | BHPA | 0.5% |  |  | Flux1 | 0.4% | BHPA | 1.1% |
| Filler | Sn72—Bi28<br>Cu Filler | 28.8%<br>61.4% | EA0297 | 76.1% | Sn42—Bi58<br>Cu Filler | 29.2%<br>62.8% | Sn42—Bi58 | 80.0% |
| Catalyst or Curing Agent | succinic acid | 1.6% | Nofuma BC-90 | 0.9% | Nofuma BC-90 | 1.3% | 2PHZ-PW | 0.9% |
| Polymer Component | BPAM-01 | 4.4% |  |  |  |  |  |  |
| Dicing Tape | TAPE1 |  | TAPE2 |  | TAPE2 |  | TAPE1 |  |
| Reaction Initiation Temperature (° C.) | 184 |  | 185 |  | 185 |  | 174 |  |
| Fracture Mode | ◯ |  | ⊚ |  | ⊚ |  | ◯ |  |
| Adhesive Strength (MPa) | 8.9 |  | 10.4 |  | 13.2 |  | 7.55 |  |
| Volume Resistivity ($\times 10^{-5}$ Ω·cm) | 9.4<br>◯ |  | 5.2<br>◯ |  | 5.1<br>◯ |  | >10<br>X |  |

|  | Comparative Example 2 |  | Comparative Example 3 |  | Comparative Example 4 |  | Comparative Example 5 |  |
|---|---|---|---|---|---|---|---|---|
| Thermosetting Resin | BMI1 | 23.0% | YL980 | 11.6% | YL980 | 4.8% | BMI2 | 5.0% |
| Flux |  |  | BHPA | 1.4% | BHPA | 0.5% | Flux1 | 1.0% |
| Filler | EA0297 | 78.1% | Sn42—Bi58 | 75.7% | Sn72—Bi28<br>Cu Filler | 28.6%<br>61.4% | Sn72—Bi28<br>Cu Filler | 30.0%<br>83.0% |
| Catalyst or Curing Agent | Luperox S31M80 | 0.9% | 2PHZ-PW | 0.7% | 2PHZ-PW | 0.3% | PERCUMYL D | 1.0% |
| Polymer Component |  |  | PKHA | 10.6% | PKHA | 4.4% |  |  |
| Dicing Tape | TAPE2 |  | TAPE1 |  | TAPE1 |  | TAPE2 |  |
| Reaction Initiation Temperature (° C.) | 62 |  | 174 |  | 174 |  | 89 |  |
| Fracture Mode | X |  | X |  | X |  | X |  |
| Adhesive Strength (MPa) | 0.98 |  | 3.5 |  | 4.8 |  | 1.4 |  |
| Volume Resistivity ($\times 10^{-5}$ Ω·cm) | >10<br>X |  | >10<br>X |  | >10<br>X |  | >10<br>X |  |

Since Examples 1 to 4 contain epoxy resin as the thermosetting resin and the reaction initiation temperature Since Example 5 contains epoxy resin as the thermosetting resin and the reaction initiation temperature between the epoxy resin and the curing agent is 180° C. or more, excellent adhesive property and conductivity were obtained.

In the Comparative Examples, because the reaction initiation temperature between the thermosetting resin and the curing agent was lower than 180° C., the resin component inhibited the binding of the filler and resulted in inferior conductivity.

DESCRIPTION OF NOTATIONS

1 . . . substrate
2 . . . pressure-sensitive adhesive layer
3, 3' . . . adhesive film (thermosetting-type adhesive film)
4 . . . semiconductor wafer
10, 12 . . . adhesive film with dicing
11 . . . dicing film

The invention claimed is:

1. A conductive adhesive composition, which comprises
(A) a thermosetting resin;
(C) a filler that contains a metal element; and
(D) at least one catalyst or curing agent,
wherein the reaction initiation temperature for the (A) thermosetting resin and the (D) at least one catalyst or curing agent is 180° C. or higher,
wherein (A) the thermosetting resin is a bismaleimide resin having the following structure:

wherein $X_1$ to $X_4$ are each independently H or an alkyl group with 1 to 6 carbons, and Q is a "C36" structure of the following formula containing a cyclohexane-base core and four long "arms" attached thereto:

2. The conductive adhesive composition according to claim 1, wherein the reaction initiation temperature for the (A) thermosetting resin and (D) at least one catalyst or curing agent is 200° C. or higher.

3. The conductive adhesive composition according to claim 1, which further comprises (B) a flux.

4. The conductive adhesive composition according to claim 3, wherein the average particle size of the (B) flux is 30 μm or smaller.

5. The conductive adhesive composition according to claim 3, wherein the (B) flux contains at least a carboxylic acid with a molecular weight of 300 or less.

6. The conductive adhesive composition according to claim 1, wherein the (A) thermosetting resin amounts to 0.5 to 20.0 percent by mass of the total mass of the solid content of the conductive adhesive composition.

7. The conductive adhesive composition according to claim 1, wherein the (C) filler contains a conductive particle C1, which contains at least one metal element R1, wherein R1 is at least one metal element selected from the group consisting of Cu, Ag, Au, Pt, Ir, Os, Pd, Ru, Ga, In, Al, Re, Zn, Ni, Sn, Bi and Sb.

8. The conductive adhesive composition according to claim 7, wherein the (C) filler is a mixture that further contains a conductive particle C2, which contains a metal element R2 other than the metal element R1.

9. The conductive adhesive composition according to claim 8, wherein the melting point of a new alloy formed by the reaction between conductive particle C1 and conductive particle C2 is lower than the melting point of R1.

10. The conductive adhesive composition according to claim 1, wherein the (C) filler amounts to 75 percent by mass or more of the total mass of the solid content of the conductive adhesive composition.

11. The conductive adhesive composition according to claim 1, wherein the (C) filler is one that is capable of forming a sintered compact.

12. The conductive adhesive composition according to claim 1, which further comprises a (E) polymer component.

13. The conductive adhesive composition according to claim 12, wherein the compounding ratio of the (E) polymer component is 5 to 50 percent by mass of the solid content of the conductive adhesive composition, excluding the mass of the (C) filler.

14. An adhesive film, which comprises the conductive adhesive composition according to claim 1 coated on to a substrate.

15. An adhesive film with dicing tape, which comprises the adhesive film of claim 14 laminated on to the dicing tape.

16. A conductive adhesive composition, which comprises
(A) a thermosetting resin;
(C) a filler that contains a metal element; and
(D) at least one catalyst or curing agent,
wherein the reaction initiation temperature for the (A) thermosetting resin and the (D) at least one catalyst or curing agent is 180° C. or higher,
wherein (A) the thermosetting resin is a bismaleimide resin having the following structure, wherein n is 1 to 20:

* * * * *